United States Patent
Okuaki

[11] Patent Number: 6,114,759
[45] Date of Patent: Sep. 5, 2000

[54] SEMICONDUCTOR PACKAGE

[75] Inventor: Katsumi Okuaki, Tokyo, Japan

[73] Assignee: NEC Corporation, Tokyo, Japan

[21] Appl. No.: 09/285,681

[22] Filed: Apr. 5, 1999

[30] Foreign Application Priority Data

Apr. 23, 1998 [JP] Japan .................................. 10-112920

[51] Int. Cl.$^7$ .............................. H01L 23/48; H01L 23/52
[52] U.S. Cl. ......................... 257/692; 257/693; 257/696
[58] Field of Search ..................................... 257/698, 692, 257/693, 773

[56] References Cited

FOREIGN PATENT DOCUMENTS

| | | |
|---|---|---|
| 2-14558 | 1/1990 | Japan . |
| 3-101156 | 4/1991 | Japan . |
| 3-169060 | 7/1991 | Japan . |
| 3-117846 | 12/1991 | Japan . |
| 4-162762 | 6/1992 | Japan . |
| 4-261054 | 9/1992 | Japan . |
| 4-343257 | 11/1992 | Japan . |
| 5-144996 | 6/1993 | Japan . |
| 5-198722 | 8/1993 | Japan . |
| 5-206361 | 8/1993 | Japan . |
| 5-315520 | 11/1993 | Japan . |
| 6-29152 | 4/1994 | Japan . |
| 6-163791 | 6/1994 | Japan . |
| 8-31686 | 2/1996 | Japan . |

OTHER PUBLICATIONS

Japanese Office Action dated Dec. 2, 1999, with partial translation.

*Primary Examiner*—Sheila V. Clark
*Attorney, Agent, or Firm*—McGinn & Gibb, P.C.

[57] ABSTRACT

A semiconductor package which can prevent peeling of outer leads from solder caused by thermal expansion and contraction, after the semiconductor package is mounted on a printed wiring board, is disclosed. The semiconductor package according to this invention includes a resin sealed body having a semiconductor chip sealed therein and outer leads led out of the resin sealed body. The outer lead has a first and second inflection parts, and the outer lead includes a first portion which defines the segment from a lead-out part of the outer lead in the resin sealed body to the first inflection part, a second portion which defines the segment from the first inflection part to the second inflection part, and a third portion which defines the segment from the second inflection part to a terminating part of the outer lead. The length of the first portion is larger than the length of the third portion.

22 Claims, 13 Drawing Sheets

SEMICONDUCTOR PACKAGE

BACKGROUND OF THE INVENTION

1. Field of the Invention

The present invention relates to a semiconductor package, and more particularly to an outer lead structure of a resin sealed semiconductor package.

2. Description of the Related Art

Along with the downsizing trend in electronic equipment utilizing semiconductor devices such as a portable telephone set, notebook personal computer and the like, fabrication of semiconductor packages in small size is being demanded for the purpose of improving the packaging density of the semiconductor devices.

One type of semiconductor packages responding to the demand is that of thin and small outline package (TSOP) which makes it possible to obtain a flat and thin product. A perspective view of a TSOP is shown in FIG. 11, in which 11a is an outer lead and 11b is a resin sealed body made of an epoxy resin or the like.

Such a semiconductor package is typically fabricated according to the following procedure. First, a semiconductor element is bonded to a semiconductor element mount part of a lead frame, then electrodes (pads) formed on the semiconductor element are connected to an inner lead part of the lead frame with bonding wires such as gold wires. Next, these parts are sealed in a resin sealing body made of an epoxy resin or the like. The resin sealed semiconductor device is then subjected to a solder plating or the like on the surface of the outer leads in order to facilitate mounting by soldering onto a mount board such as a printed wiring board. Next, after cutting off unnecessary parts of the lead frame, the outer leads are worked into a gull wing shape regulated by predetermined dimensions. Finally, markings are given on the surface of the resin sealed body, completing the assembly process of the semiconductor device.

The semiconductor device fabricated according to the above processes is mounted on a mount board such as a printed wiring board. The outer leads 11a led out of the resin sealed body 11b of the lead frame are connected to the inner leads (not shown) within the resin sealed body 11b. Consequently, the electrode formed on the semiconductor element is connectable to a wiring on the mount board via a bonding wire, inner lead, and outer lead 11a.

FIG. 12 is a partial enlarged sectional view of the region from the peripheral part to the outer lead of the resin sealed body of the TSOP shown in FIG. 11. In FIG. 12, the length and the angle of the outer lead are drawn in proportion to the length and the angle of the outer lead of an actual semiconductor package, the thickness of the outer lead is drawn emphatically considering ease in viewing the drawing.

The dimensions and the angle of the outer lead 11a led out of the resin sealed body 11b are regulated to predetermined values according to the standards of the following five items.

In FIG. 12, 11c is the item regulating the horizontal distance from the edge surface of the resin sealed body 11b to the terminating part of the outer lead worked into the gull wing shape.

Item 11d regulates the vertical distance from the base plane of the outer lead 11a worked into the gull wing shape to the base plane of the resin sealed body 11b.

Item 11e regulates the planarity (angle α) of the base plane of the outer lead 11a worked into the gull wing shape.

Item 11f regulates the base plane length from the second inflection point of the outer lead 11a worked into the gull wing shape to the terminating part of the outer lead.

Item 11g regulates the thickness of the outer lead 11a.

Finally, item 11h regulates the height of the upper surface of the resin sealed body 11b as measured from the base plane of the outer lead, although it does not regulate directly the outer shape and the dimensions of the outer lead 11a.

In a miniaturized semiconductor device such as a TSOP, the outer leads that are worked into a gull wing shape are also formed to have a very short length. Problems entailing short formation of the outer leads will be described below.

In a semiconductor device, the semiconductor element itself sealed within the resin sealed body 11b generates heat as a result of its electrical activities. A part of the heat generated by the semiconductor element is dissipated directly into the surroundings of the semiconductor device via the resin sealed body 11b which is sealing the semiconductor element. Another part of the generated heat is dissipated into the surrounding atmosphere and to the mount board on which the semiconductor device is mounted, from the electrodes formed on the semiconductor element via the bonding wires, inner leads and the outer leads led out of the resin sealed body 11b. The mount board is heated by the heat generated by the semiconductor device and other electronic components, and is also heated by the electric currents flowing in the metallic wiring layer patterned on the mount board itself.

Accompanying such heat generation and heat dissipation in the semiconductor device and the mount board, the resin sealed body, the outer leads, and the mount board undergo elongation and contraction though they are slight. The amounts of elongation and contraction differ respectively depending upon the difference in the linear coefficient of thermal expansion of the resin sealed body, the outer lead, and the mount board as well as the temperature of respective parts.

Under these circumstances, when the resin sealed body, the outer leads, and the mount board repeat elongation and contraction accompanying heat generation and heat dissipation in the semiconductor device, the bonding strength of the solder connecting the semiconductor device to the mount board is deteriorated, and in the worst situation, a failure will occur in which some of the outer leads of the semiconductor device peel off the mount board.

Besides the elongation and contraction caused by the generation of heat in the semiconductor device itself, the resin sealed body, the outer leads, and the mount board undergoes, though slight, elongation and contraction due to temperature changes in the environment in which the semiconductor device and the mount board that has the semiconductor device on it are installed or otherwise left standing. Similar to the description in the above, as the effect of the temperature changes in the environment alone, or as the synergic effect of the temperature changes and of elongation and contraction caused by heat generation and heat dissipation in the semiconductor device itself, the bonding strength of soldering of the outer leads is deteriorated, and in the worst situation, a failure will occur in which the outer leads peel off the mount board.

In a conventional flat package type semiconductor device having outer leads 11a worked into a gull wing shape, the values for items 11c to 11h which are regulating the height of the semiconductor device and the external dimensions of the outer lead 11a are set at low levels in order to raise the surface mountability of the device. In particular, since the lead length (11x) from a first inflection point on the semiconductor device side to a second inflection point is set to be small (11x<11f), the outer leads 11a are unable to sufficiently fulfill the function as a buffer material against the difference in the elongation/contraction generated respectively in the resin sealed body, the outer leads, and the mount board caused by heat generation/heat dissipation of the semiconductor device itself and/or by the temperature changes in the environment in which the semiconductor device and the mount board on which the semiconductor device is mounted are installed or otherwise left standing. As a result, the bonding strength of the solder is deteriorated, and in the worst situation, the problem of peeling of the outer leads of the semiconductor device from the mount board becomes more serious.

On the other hand, in Publication of Unexamined Patent Applications No. Hei 2-14558 there is proposed, as shown in FIGS. 13 and 14, to bend a free end part 22a of an outer lead 22, worked into a gull wing shape, in the direction to be away from a printed wiring board 24 on which a semiconductor integrated device 21 is mounted. By working the outer leads 22 in this manner, it is said that a sufficient "wettability to solder 25" can be obtained at the free end parts 22a, and a sufficient soldering strength can be secured.

In the conventional example described in Publication of Unexamined Patent Applications No. Hei 2-14558, although the strength of the soldering itself is enhanced by bending the terminating parts of the outer leads worked into a gull wing shape, the fact remains unchanged also in the example shown in FIG. 12 that the length (x) of the outer lead from the first inflection point to the second inflection point is short (x<f). Consequently, the outer leads do not function sufficiently well as a buffer material against elongation and contraction, the bonding strength of the solder which is connecting the semiconductor device to the mount board is deteriorated as a result of repeated elongation and contraction of the various parts, and in the worst situation, the problem that the outer leads of the semiconductor device peel off the mount board still remains unresolved.

SUMMARY OF THE INVENTION

It is therefore an object of the present invention to provide a semiconductor package in which the outer leads function sufficiently effectively as a buffer material against elongation and contraction of the various parts.

The semiconductor package according to this invention has a resin sealed body in which a semiconductor chip is sealed, and outer leads which are led out of the resin sealed body, wherein the outer leads have first and second inflection parts, with both angles of the first and second inflection parts being characterized in that they are less than 90°.

Moreover, the semiconductor package according to this invention has a resin sealed body in which is sealed a semiconductor chip, and outer leads led out of the resin sealed body, wherein the outer lead has at least a first part which regulates the length from the lead-out part of the resin sealed body to the first inflection part, and a second part which regulates the length from the first inflection part to the second inflection part where the second inflection part is characterized in that it is located closer to the resin sealed body than the first inflection part.

Furthermore, the semiconductor package according to this invention has a resin sealed body in which is sealed a semiconductor chip, and outer leads led out of the resin sealed body, wherein the outer lead has a first and second inflection parts, and the outer lead includes a first part which regulates the length between the lead-out part of the resin sealed body and the first inflection part, a second part which regulates the length between the first inflection part and the second inflection part, and a third part which regulates the length between the second inflection part and the terminating part of the outer lead, with the length of the first part being longer than the length of the third part.

Furthermore, the semiconductor package according to this invention has a resin sealed body in which is sealed the semiconductor chip, and outer leads led out of the resin sealed body, wherein the outer lead has at least three inflection parts. In this case, it is preferable that at least one out of the three inflection parts has an angle less than 90°. In addition, it is preferable to form at least one out of the three inflection parts into U shape.

Still further, the semiconductor package according to this invention has a resin sealed body in which is sealed a semiconductor chip, and outer leads led out of the resin sealed body, wherein the outer lead consists of a lead-out part which leads out of the resin sealed body, a fixing part which fixes the package to a printed wiring board, and a connection part which connects the lead out part to the fixing part, and the connection part has spring property. In this case, it is preferable that the connection part is formed in U shape. In addition, it is preferable to form the connection part in spiral form.

In this way, according to this invention, a semiconductor package is provided which can function sufficiently effectively as a buffer material against elongation and contraction of the various parts while fulfilling all of the conventional regulations of items 11c to 11h.

In other words, according to this invention, the length of the outer lead from the outer lead lead-out part on the side face of the resin sealed body to the soldered part is made larger compared with that of the conventional case. Accordingly, the outer leads can be made to function as a buffer material against the difference in the elongation/contraction length in each of the resin sealed body, the outer leads, and the mount board generated due to generation/dissipation of heat in the semiconductor device, and temperature changes or the like in the environment in which the mount board on which is mounted the semiconductor device is installed or left standing.

As a result, deterioration in the bonding strength of soldering which connects the semiconductor device to the mount board can be prevented, and the failure of peeling of the outer leads of the semiconductor device from the mount board can be avoided.

Moreover, the height and external dimensions of the outer lead of a semiconductor device having outer leads according to this invention satisfy all of the standardized values of the height and the outer dimensions of the outer lead specified for the conventional semiconductor device. Accordingly, it is possible to solder the semiconductor device of this invention to the electrode part conventionally patterned on the mount board without changing the layout of the electrodes, and to obtain the same packaging density as that of the conventional semiconductor device.

BRIEF DESCRIPTION OF THE DRAWINGS

The above and other objects, features and advantages of the present invention will be more apparent from the following description taken in conjunction with the accompanying drawings, in which.

DESCRIPTION OF THE PREFERRED EMBODIMENTS

Figure 1:
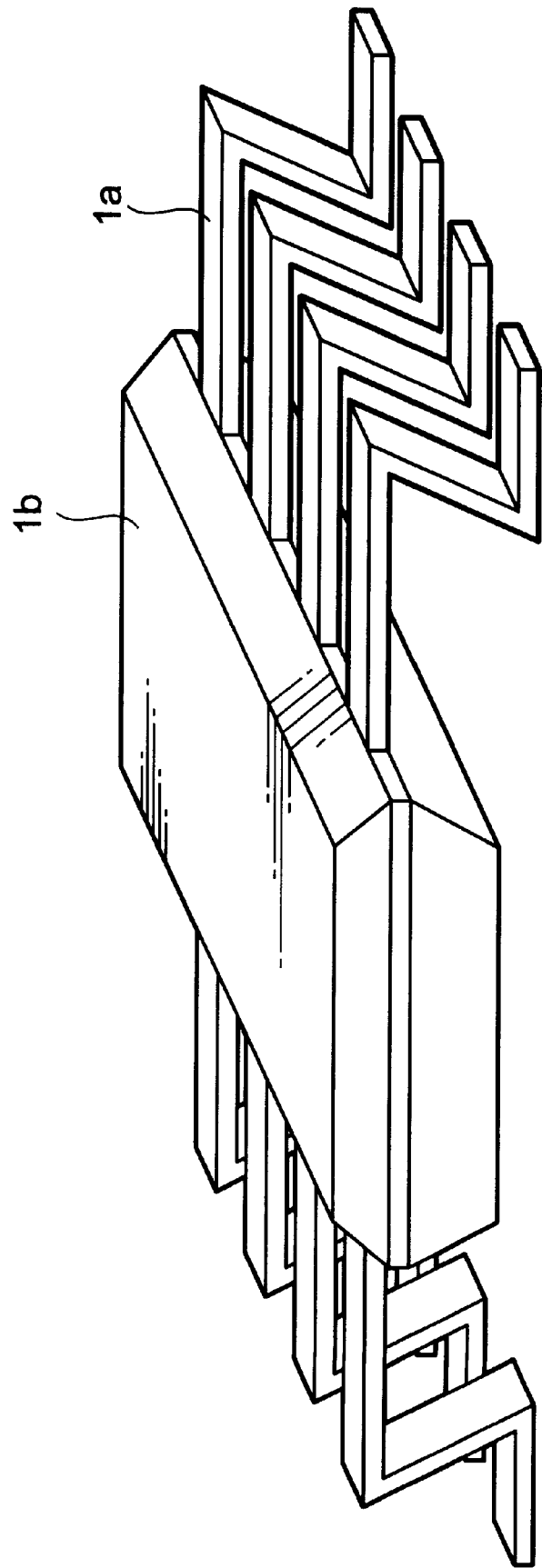
FIG. 1 is a perspective view of a semiconductor package according to a first embodiment of this invention.

In one embodiment of the semiconductor device of this invention, the outer lead has two inflection points, namely, a first inflection point situated adjacent to the resin sealed body and a second inflection point linked to the soldered part, and the length from the resin sealed body to the first inflection point is larger than the length from the second inflection point to the tip part of the lead. In this case, the side view of the outer lead may be given either a Z shape or a U shape.

In another embodiment, the outer lead has a first inflection point situated adjacent to the resin sealed body and a second inflection point linked to the soldered part, and has a third inflection point inserted between the first and second inflection points. In this case, the outer lead led out of the resin sealed body is bent upward at the first inflection point, and is bent at the third inflection point either with an acute angle or bent in a circular shape (inverted U shape).

In addition, a fourth inflection point may further be inserted between the first and second inflection points.

In still another embodiment, the outer lead has at least one spirally formed part.

Next, referring to the drawings, the embodiments of this invention will be described in detail.

FIG. 1 is a perspective view showing a first embodiment of this invention. In the figure, 1a is an outer lead, and 1b is a resin sealed body made of an epoxy resin or the like. The outer lead 1a which is led to the outside from the resin sealed body 1b of a lead frame is connected to an inner lead (not shown) within the resin sealed body. In other words, although not illustrated in the figure, the outer lead 1a outer lead 1a is connected to an electrode formed on a semiconductor element via the inner lead and a bonding wire.

Figure 2:
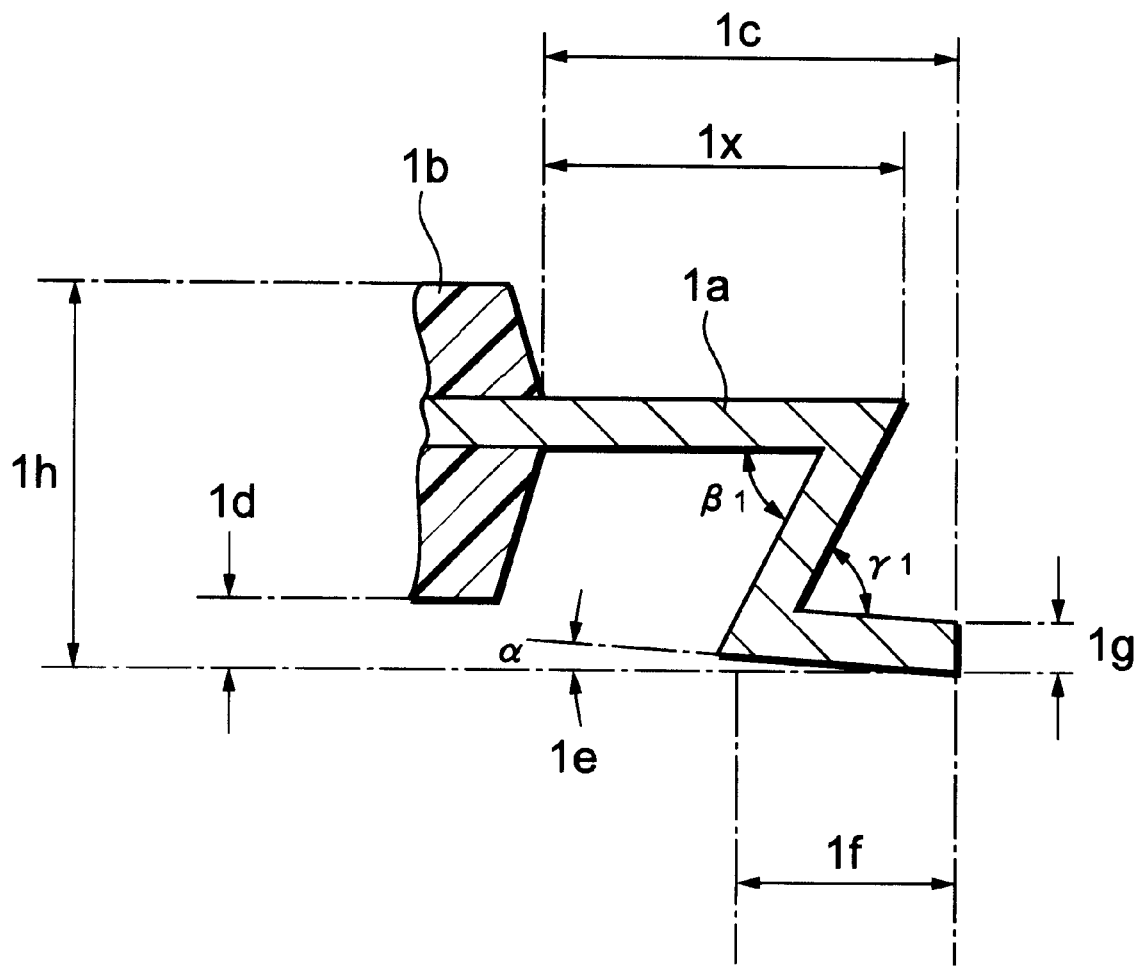
FIG. 2 is an enlarged partial sectional view of the semiconductor package according to the first embodiment of this invention.

In FIG. 2 is shown a partial enlarged sectional view of the section of the semiconductor device covering the range from the edge part of the resin sealed body to the outer lead, in which are shown the dimensions and the angle related to the semiconductor device, especially to the outer lead. Principal differences between the semiconductor device of this embodiment and the conventional semiconductor device will be described with reference to FIG. 2 and FIG. 12.

Figure 11:
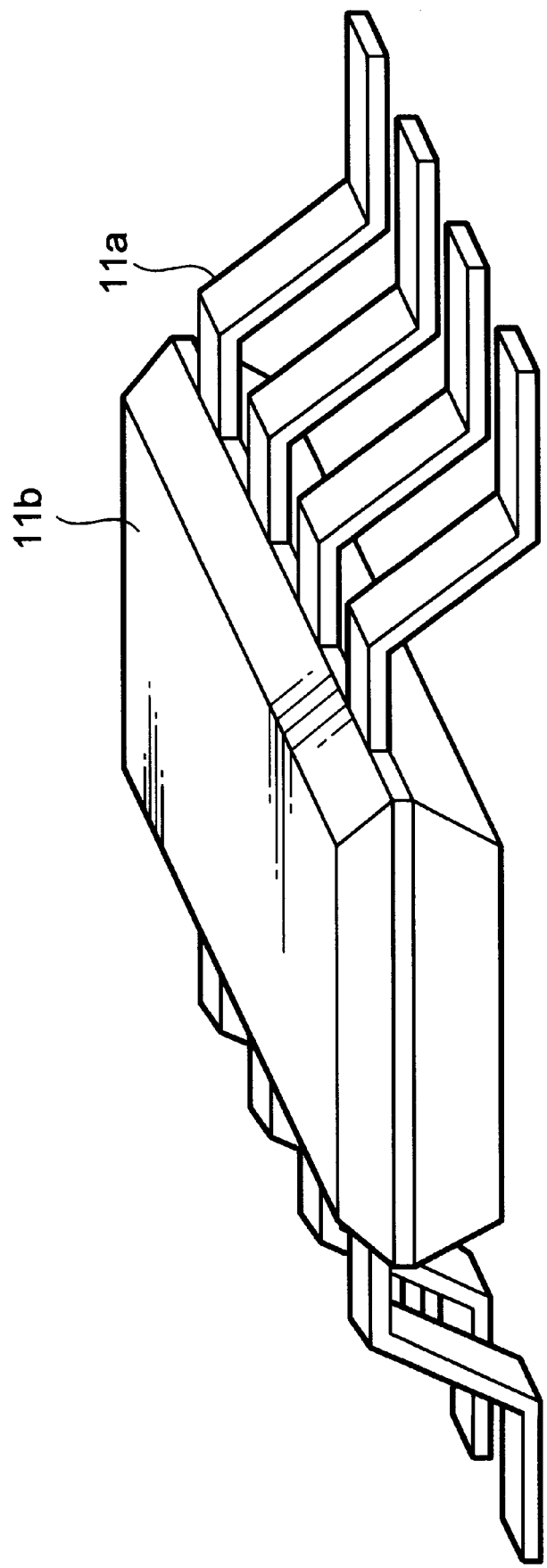
FIG. 11 is a perspective view showing a conventional semiconductor package.

In the semiconductor device according to the first embodiment of this invention, the outer lead led out of the side face of the resin sealed body 1b is worked into a Z shape in which the length (1x) of the portion of the outer lead from the side face of the resin sealed body 1b to a first inflection point is larger than the length (1f) of the portion from a second inflection point to the terminating part of the outer lead. In this outer lead 1a, the length of the portion of the outer lead, 1a, is made larger than the length of the portion of the outer lead, 11a, shown in FIG. 11 and FIG. 12 by making the angle at the first inflection point acute.

Figure 12:
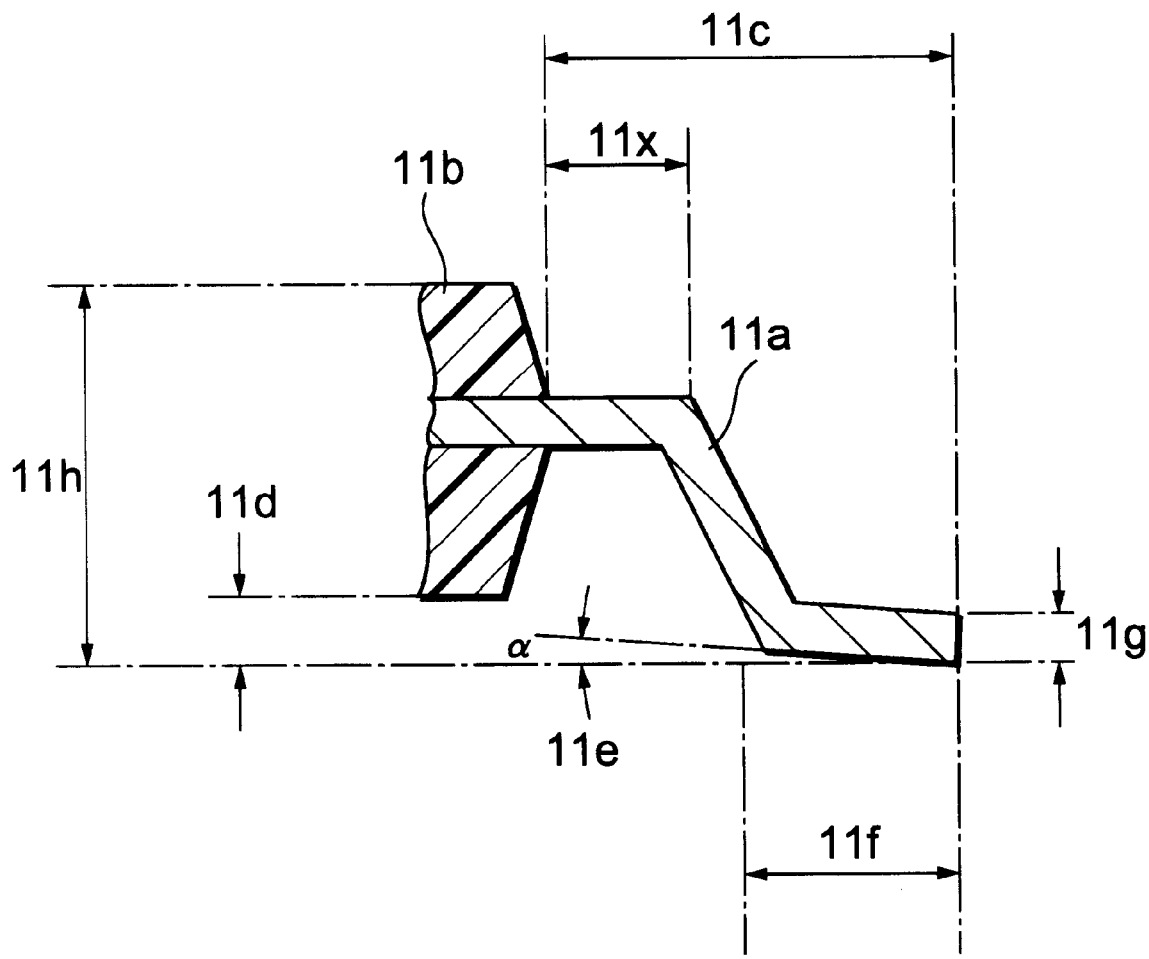
FIG. 12 is an enlarged partial sectional view of the conventional semiconductor package.
Figure 13:
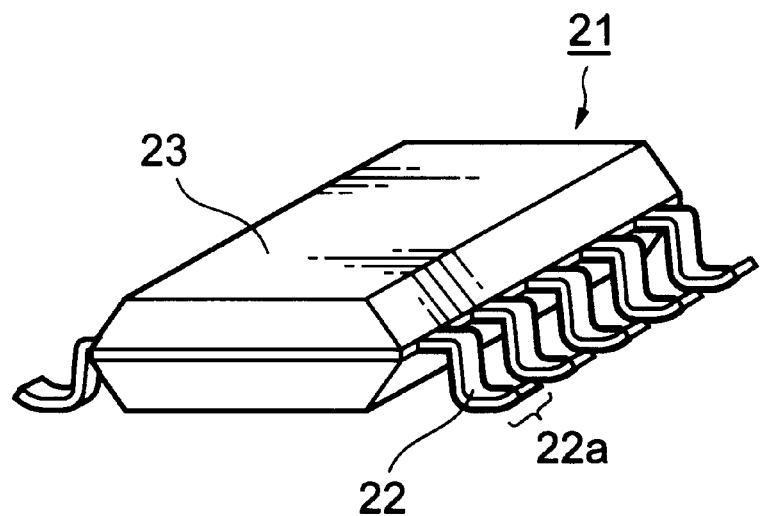
FIG. 13 is a perspective view of a semiconductor integrated circuit device proposed in Publication of Unexamined Patent Applications No. Hei 2-14558.
Figure 14:
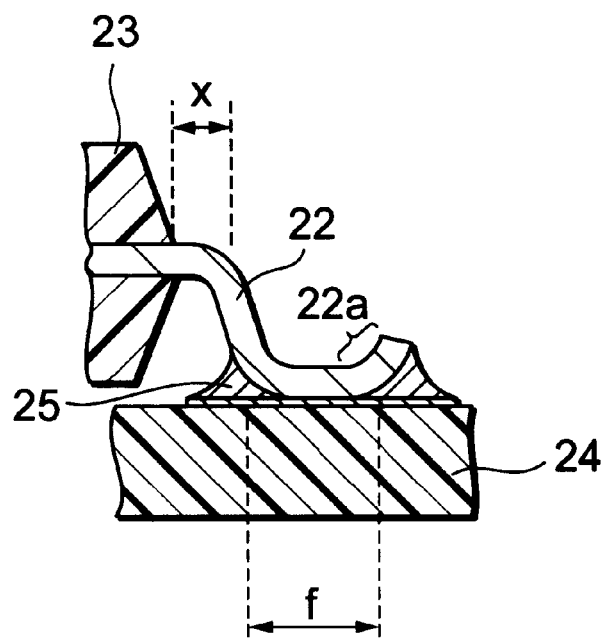
FIG. 14 is an enlarged partial sectional view of the semiconductor integrated circuit device proposed in Publication of Unexamined Patent Applications No. Hei 2-14558.

Moreover, in the semiconductor device of this embodiment, the values of the dimensions and the angle pertaining to the outer lead 1a, represented by the items 1c to 1g in FIG. 2, satisfy all of the conventional standardized values pertaining to the outer lead specified by the items 11c to 11g in FIG. 12.

Namely, 1c represents the horizontal distance from the side face of the resin sealed body 1b to the tip part of the outer lead 1a, and its value satisfies the standardized value defined as the horizontal distance specifying item 11c for the conventional semiconductor device as shown in FIG. 12.

Further, 1d represents the vertical distance from the base plane of the outer lead 1a to the base plane of the resin sealed body 1b, and its value satisfies the standardized value defined as the vertical distance specifying item 11d for the conventional semiconductor device as shown in FIG. 12.

Further, 1e represents the angle between the base plane of the outer lead 1a and the horizontal plane, and its value satisfies the standardized value defined as the planarity specifying item 11e for the conventional semiconductor device as shown in FIG. 12.

Further, 1f represents the length from the second inflection point of the outer lead 1a to the terminating part of the outer lead 1a, and its value satisfies the standardized value defined as the length specifying item 11f for the conventional semiconductor device as shown in FIG. 12.

Further, 1g represents the thickness of the outer lead 1a, and its value satisfies the standardized value defined as the thickness specifying item 11g for the conventional semiconductor device as shown in FIG. 12.

Finally, 1h represents the height of the semiconductor device, and its value satisfies the standardized value 11h defined as the height specifying item 11h for the conventional semiconductor device as shown in FIG. 12.

Here, if the segment of the outer lead 1a from the leadout part of the resin sealed body 1b to the first inflection point is defined as a "first portion", the segment from the first inflection point to the second inflection point is defined as a "second portion", the segment from the second inflection point to the terminating part is defined as a "third portion", it is preferable that the angle $\beta_1$ formed by the first and the second portions and the angle $\gamma_1$ formed by the second and the third portions are less than 90°. In the example shown in FIG. 2, the angles $\beta_1$ and $\gamma_1$ are both about 60°.

Figure 3:
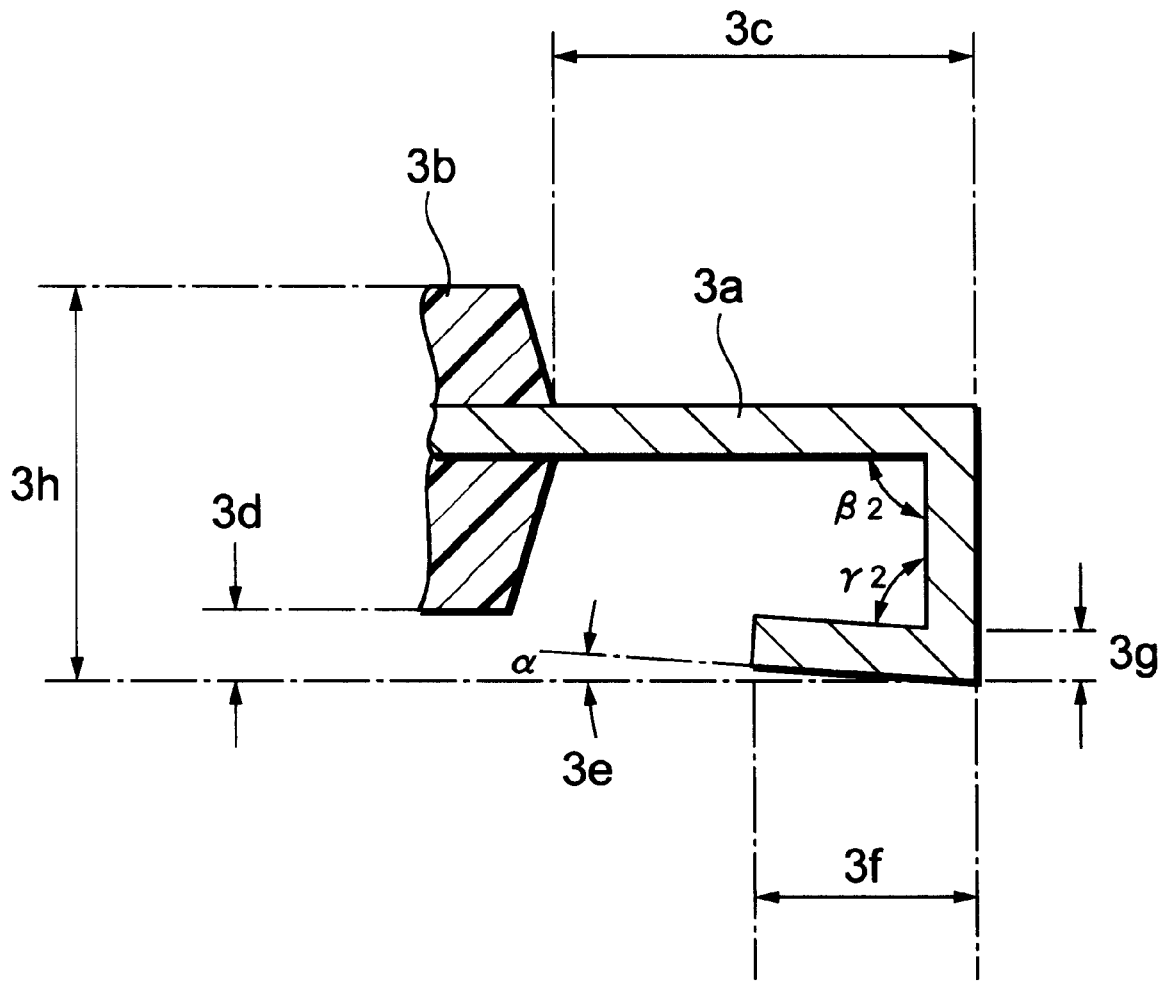
FIG. 3 is an enlarged partial sectional view of the semiconductor package according to a second embodiment of this invention.

FIG. 3 is a partial enlarged sectional view showing a second embodiment of this invention. In this embodiment, the length from the side face of the resin sealed body 3b to a first inflection point of the outer lead 3a is extended to a dimension which satisfies the item 11c showing the specification for the horizontal distance, the length of the portion of the outer lead from the side face of the resin sealed body to a first inflection point is made larger than the length of the portion of the outer lead from a second inflection to the terminating part, and the overall form of the outer lead is worked into the shape of the letter U.

In the semiconductor device of this embodiment, the values of the dimensions and the angle pertaining to the outer lead shown by the items 3c to 3g in FIG. 3 satisfy all of the standardized values for the dimensions and the angle pertaining to the outer lead defined as the items 11c to 11g for the conventional semiconductor device as shown in FIG. 12. Moreover, the height of the semiconductor device 3b meets the specification of the item 11h defining the height of the conventional semiconductor device as shown in FIG. 12.

Here, if the segment of the outer lead 3a from the lead-out part of the resin sealed body 3b to the first inflection point is defined as a "first portion", the segment from the first inflection point to the second inflection point is defined as a "second portion", and the segment from the second inflection point to the terminating part is defined as a "third portion", it is preferable that the angle $\beta_2$ formed by the first and second portions and the angle $\gamma_2$ formed by the second and third portions are 90°.

Figure 4:
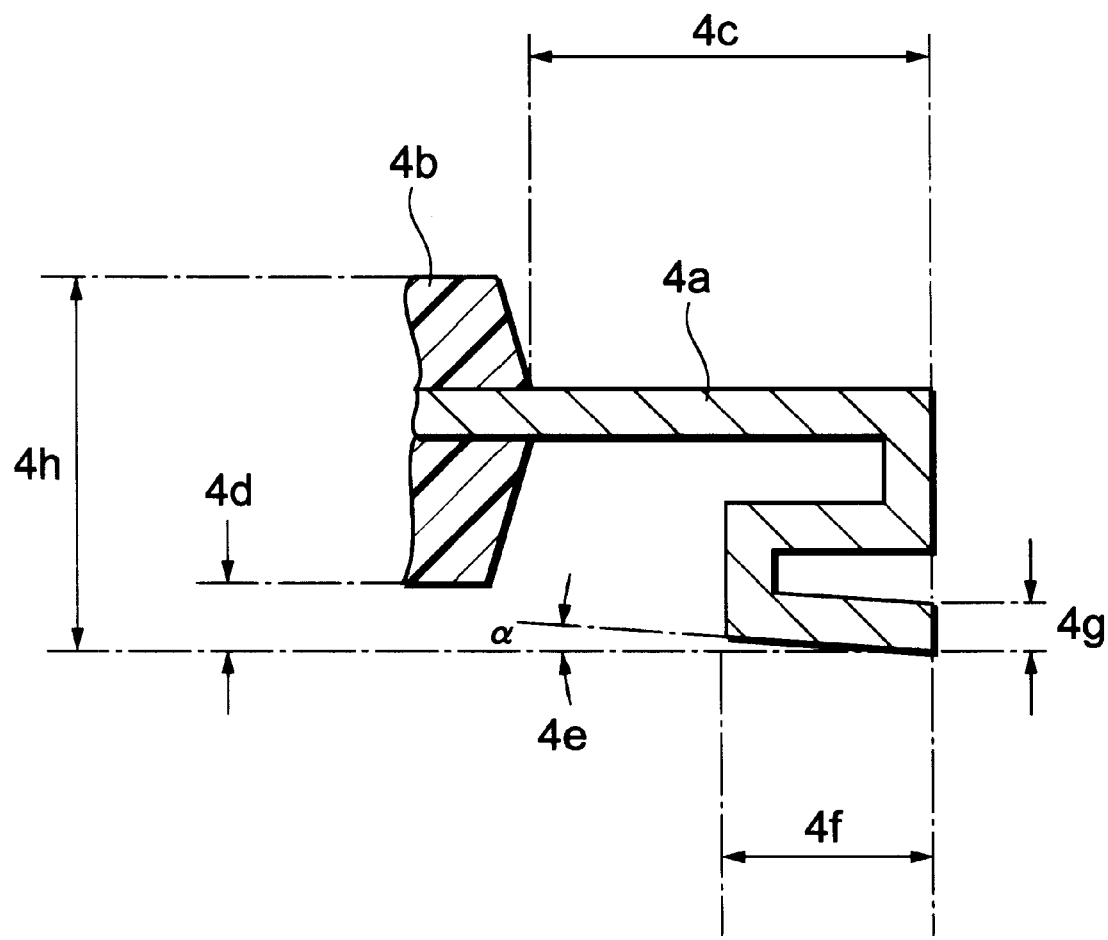
FIG. 4 is an enlarged partial sectional view of the semiconductor package according to a third embodiment of this invention.

FIG. 4 is a partial enlarged sectional view showing a third embodiment of this invention. In this embodiment, the outer lead 4a has four inflection points, the length of the outer lead 4a from the side face of the resin sealed body 4b to a first inflection point is extended to a dimension satisfying the standardized value defined by the horizontal distance specifying item 11c, and the outer lead 4a led out of the side face of the resin sealed body 4b is worked into a shape which arrives at the terminating part through the first, second, third, and fourth inflection points.

In the semiconductor device of this embodiment, the values of the dimensions and the angle pertaining to the outer lead shown by 4c to 4g satisfy all of the standardized values for the dimensions and the angle pertaining to the outer lead defined by the items 11c to 11g for the conventional device as shown in FIG. 12. In addition, the height 4h of this semiconductor device meets the specification of the item 11h defining the height of the conventional semiconductor device as shown in FIG. 12.

Here, if the segment of the outer lead from the lead-out part of the resin sealed body 4b to the first inflection point is defined as a "first portion", the segment from the first inflection point to the second inflection point is defined as a "second portion", the segment from the second inflection point to the third inflection point is defined as a "third portion", the segment from the third inflection point to the fourth inflection point is defined as a "fourth portion", and the segment from the fourth inflection point to the terminating part is defined as a "fifth portion", it is preferable that the angle formed by the first and second portions and the angle formed by the fourth and fifth portions are both about 90°. The angle formed by the second and third portions and the angle formed by the third and fourth portions are not particularly limited. That is, they may be either more than 90°or less than 90°. In the example shown in FIG. 4, these angles are both about 90°.

Figure 5:
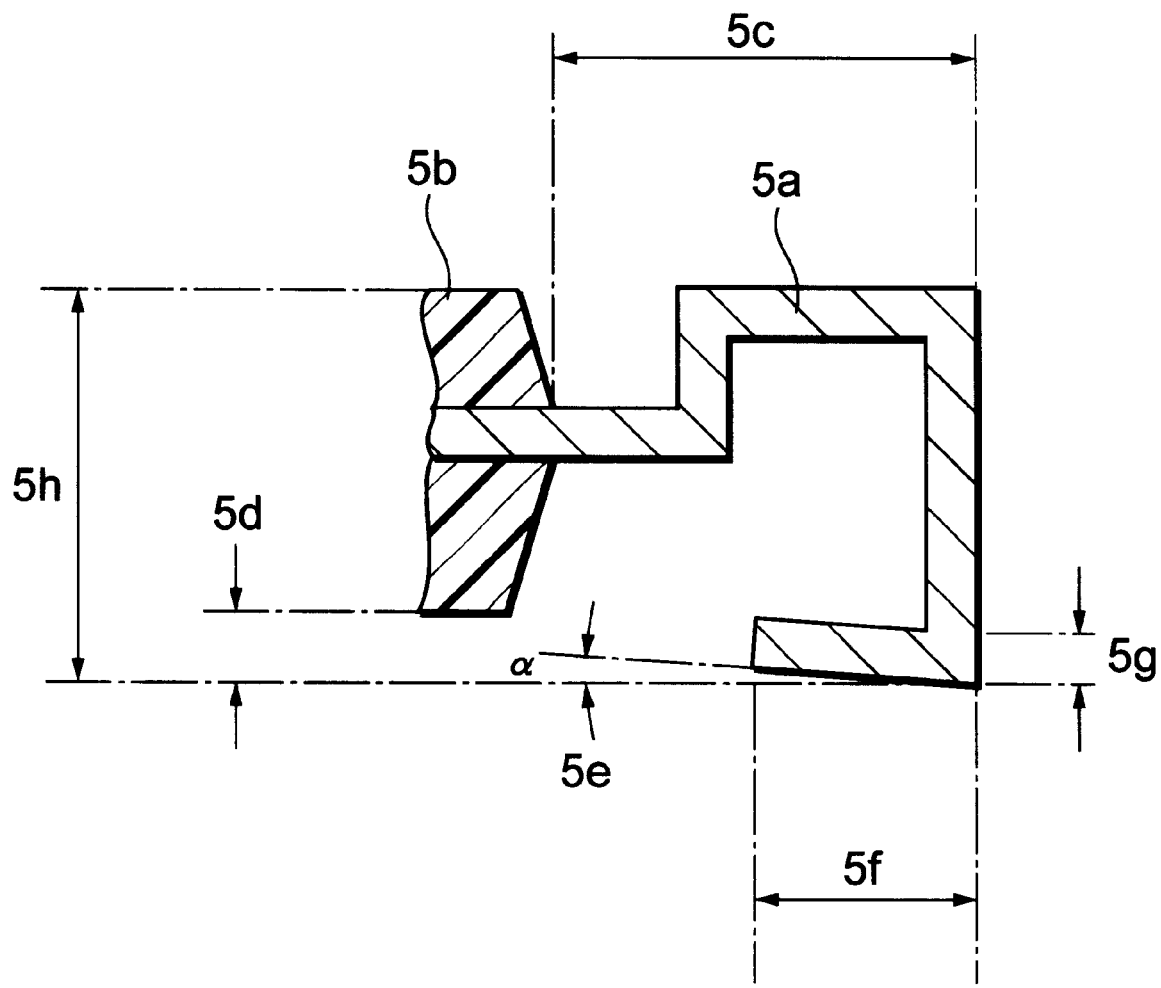
FIG. 5 is an enlarged partial sectional view of the semiconductor package according to a fourth embodiment of this invention.

FIG. 5 is a partial enlarged sectional view showing a fourth embodiment of this invention. In this embodiment, the outer lead 5a also has four inflection points, and is bent upward at a first inflection point, bent in the horizontal direction at a second inflection point, bent downward at a third inflection point, and finally bent horizontally inward at a fourth inflection point. The upper surface of the outer lead 5a from the second inflection point to the third inflection point is level with the upper surface of the resin sealed body 5b, and the horizontal distance 5c from the side face of the resin sealed body 5b to the second inflection point is made to satisfy the standardized value defined by the horizontal distance specifying item 11c.

However, it is not necessarily required that the upper surface of the outer lead 5a for the portion from the second inflection point to the third inflection point be perfectly level with the upper surface of the resin sealed body 5b, and the upper surface of the portion of the outer lead from the second inflection point to the third inflection point may be lower than the upper surface of the resin sealed body 5b.

In the semiconductor device of this embodiment, the values of the dimensions and the angle pertaining to the outer lead 5a shown by 5c to 5g satisfy all of the standardized values of the dimensions and the angle pertaining to the outer lead specified by the items 11c to 11g for the conventional device as shown in FIG. 12. Moreover, the height 5h of the semiconductor device meets the specification of the item 11h defining the height of the conventional semiconductor device as shown in FIG. 12.

Here, if the segment of the outer lead 5a from the lead-out part of the resin sealed body 5b to the first inflection point is defined as a "first portion", the segment from the first inflection point to the second inflection point is defined as a "second portion", and the segment from the second inflection point to the third inflection point is defined as a "third portion", the segment from the third inflection point to the fourth inflection point is defined as a "fourth portion", and the segment from the fourth inflection point to the terminating part is defined as a "fifth portion", then it is preferable that the angle formed by the third and fourth portions and the angle formed by the fourth and fifth portions are both about 90°. The angle formed by the first and second portions and the angle formed by the second and third portions are not particularly limited. Namely, they may either be more than 90° or less than 90°. In the example shown in FIG. 5, these angles are both about 90°.

Figure 6:
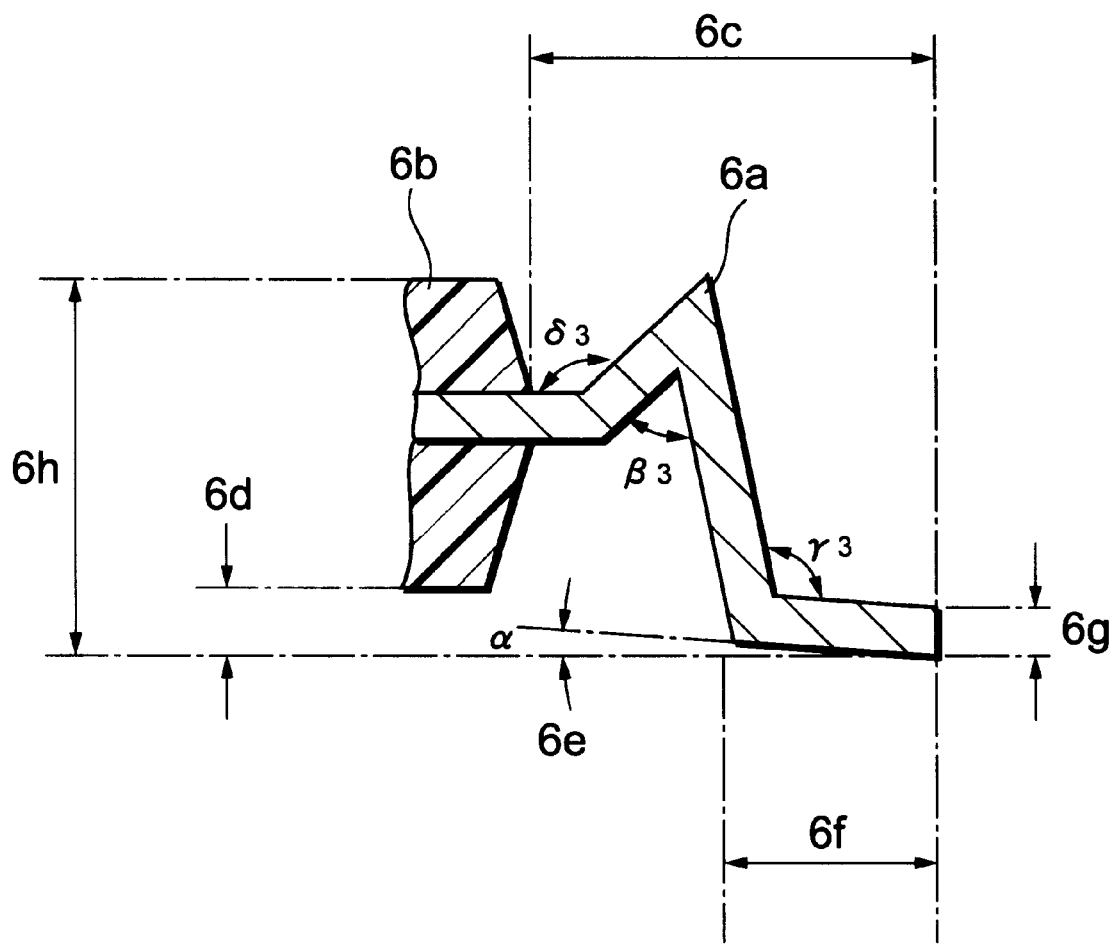
FIG. 6 is an enlarged partial sectional view of the semiconductor package according to a fifth embodiment of this invention.

FIG. 6 is an enlarged partial sectional view showing a fifth embodiment of this invention. In this embodiment, the outer lead has three inflection points, and it is bent upward with an obtuse angle (90 to 180°) at a first inflection point, bent downward with an acute angle (0 to 90°) at a second inflection point, and bent outward substantially in the horizontal direction at a third inflection point. In addition, the height of the outer lead. 6a at the second inflection point is equal to the height of the upper surface of the resin sealed body 6b.

In the semiconductor device of this embodiment, the values of the dimensions and the angle indicated by 6c to 6g pertaining to the outer lead satisfy all of the standardized values of the dimensions and the angle pertaining to the outer lead specified by the items 11c to 11g for the conventional semiconductor device as shown in FIG. 12. In addition, the height 6h of the semiconductor device meets the specification of the item 11h which defines the height of the conventional semiconductor device.

However, it is not necessarily required that the height of the outer lead 6a at the second inflection point agree perfectly with the height of the upper surface of the resin sealed body 6b, and the height of the outer lead 6a may be lower than the height of the upper surface of the resin sealed body 6b.

Here, if the segment of the outer lead 6a from the lead-out part of the outer lead in the resin sealed body 6b to the first inflection point is defined as a "first portion", the segment from the first inflection point to the second inflection point is defined as a "second portion", the segment from the second inflection point to the third inflection point is defined as a "third portion", and the segment from the third inflection point to the terminating part is defined as a "fourth portion", then the angle $\delta_3$ formed by the first and second portions is larger than 90°, and the angle $\beta_3$ formed by the second and third portions is less than 90° as mentioned above, but the angle $\gamma_3$ formed by the third and fourth portions is not particularly limited. Namely, it may be more than 90° or less than 90°. In the example shown in FIG. 6, the angle is $\delta_3$ is about 135°, the angle $\beta_3$ is about 60°, and the angle $\gamma_3$ is about 105°.

Figure 7:
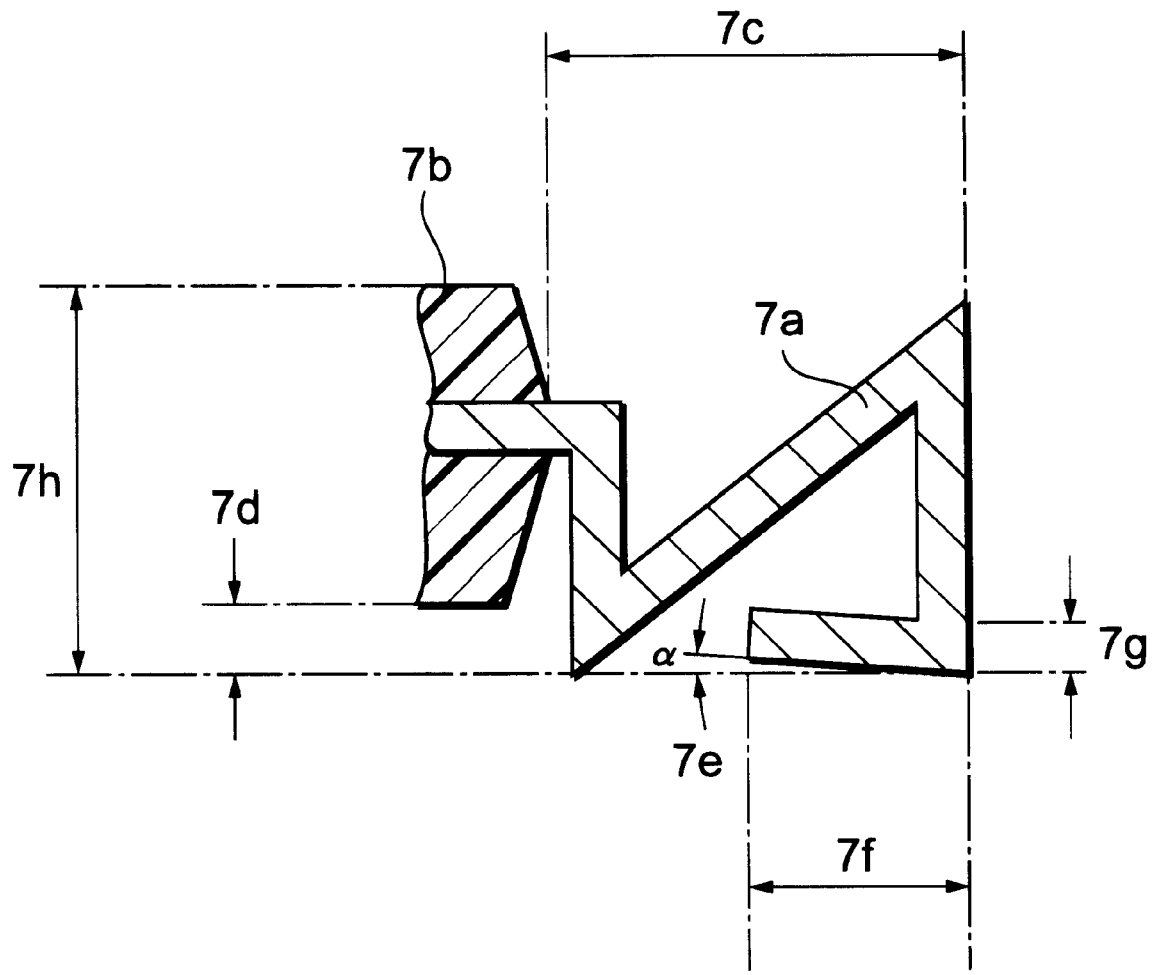
FIG. 7 is an enlarged partial sectional view of the semiconductor package according to a sixth embodiment of this invention.

FIG. 7 is an enlarged partial sectional view of a sixth embodiment of this invention. In this embodiment, the outer lead 7a has four inflection points, and it is bent vertically downward at a first inflection point, bent upward with an acute angle at a second inflection point, bent vertically downward with an acute angle at a third inflection point, and finally bent substantially horizontally inward at a fourth inflection point. Here, the height of the outer lead at the third inflection point agrees with the height of the upper surface of the resin sealed body 7b, and the horizontal distance 7c of the outer lead 7a from the side face of the resin sealed body 7b to the third inflection point is given a dimension which satisfies the standardized value defined by the horizontal distance specifying item 11c for the conventional semiconductor device.

In the semiconductor device of this embodiment, the values of the dimensions and the angle pertaining to the outer lead indicated by 7d to 7g satisfy all of the standardized values of the dimensions and the angle pertaining to the outer lead defined by the items 11d to 11g for the conventional semiconductor device as shown in FIG. 12. In addition, the height 7h of the semiconductor device meets the specification of the item 11h defining the height of the conventional semiconductor device as shown in FIG. 12.

However, the height of the outer lead 7a at the third inflection point is not necessarily required to agree perfectly with the height of the upper surface of the resin sealed body 7b, and the height of the outer lead 7a at the third inflection point may be lower than the height of the upper surface of the resin sealed body 7b.

Here, if the segment from the lead-out part of the outer lead in the resin sealed body 7b to the first inflection point of the outer lead 7a is defined as a "first portion", the segment from the first inflection point to the second inflection point is defined as a "second portion", the segment from the second inflection point to the third inflection point is defined as a "third portion", the segment from the third inflection point to the fourth inflection point is defined as a "fourth portion", and the segment from the fourth inflection point to the terminating part is defined as a "fifth portion", then it is preferable that the angle formed by the fourth and fifth portions is about 90°. The angle formed by the first and second portions is not particularly limited. In the example shown in FIG. 7, the angle formed by the first and second portions and the angle formed by the fourth and fifth portions are both about 90°, and the angle formed by the second and third portions and the angle formed by the third and fourth portions are both about 50°.

Figure 8:
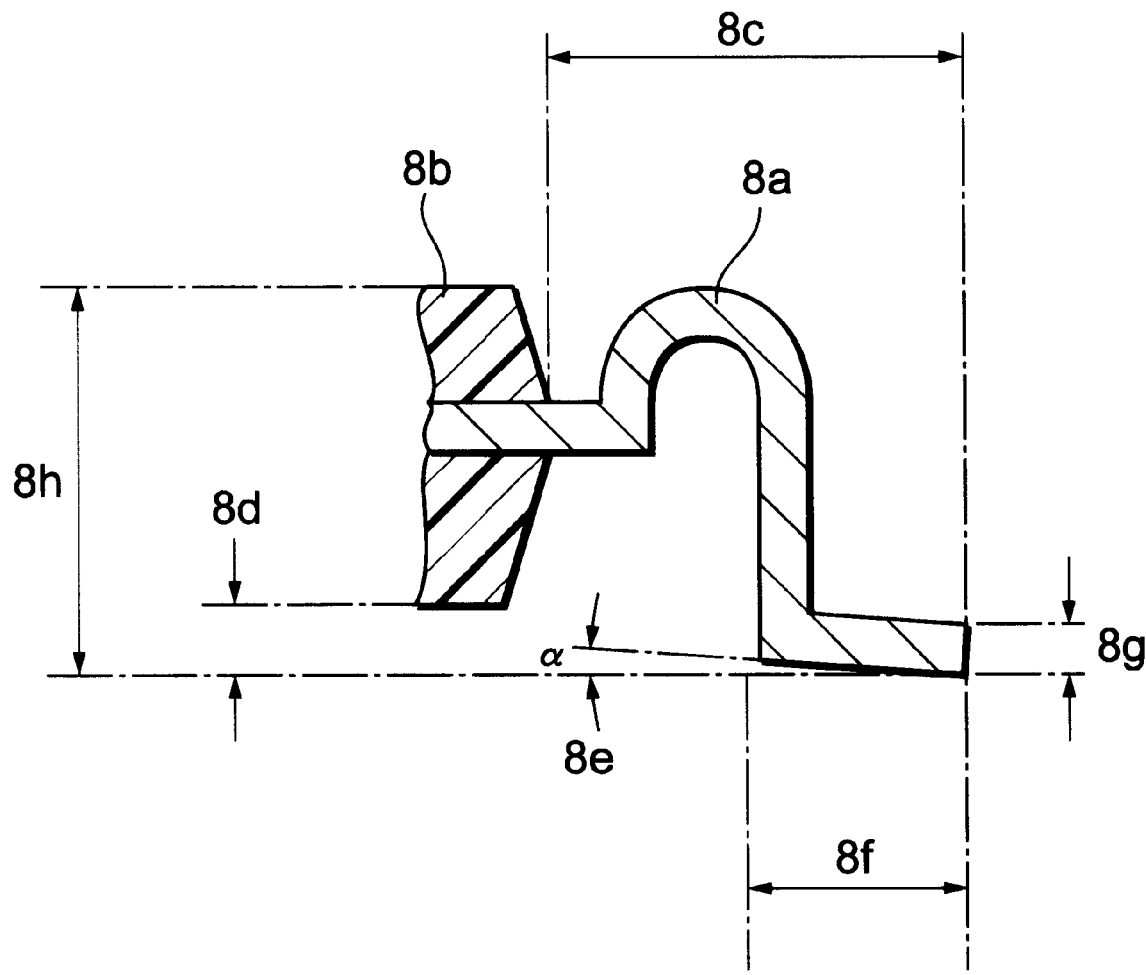
FIG. 8 is an enlarged partial sectional view of the semiconductor package according to a seventh embodiment of this invention.

FIG. 8 is an enlarged partial sectional view showing a seventh embodiment of this invention. In this embodiment, the outer lead 8a has three inflection points, and it is bent vertically upward at a first inflection point, bent in inverted U shape at a second inflection point, and finally bent outward substantially horizontally at a third inflection point. The height of the outer lead 8a at the second inflection point agrees with the height of the upper surface of the resin sealed body 8b.

In the semiconductor device of this embodiment, the values of the dimensions and the angle pertaining to the outer lead indicated by 8c to 8g satisfy all of the standardized values of the dimensions and the angle pertaining to the outer lead specifying the items 11c to 11g for the conventional semiconductor device as shown in FIG. 12.

However, the height of the outer lead 8a at the second inflection point is not necessarily required to agree perfectly with the height of the upper surface of the resin sealed body 8b, and the height at the second inflection point of the outer lead 8a may be lower than the height of the upper surface of the resin sealed body 8b.

Figure 9:
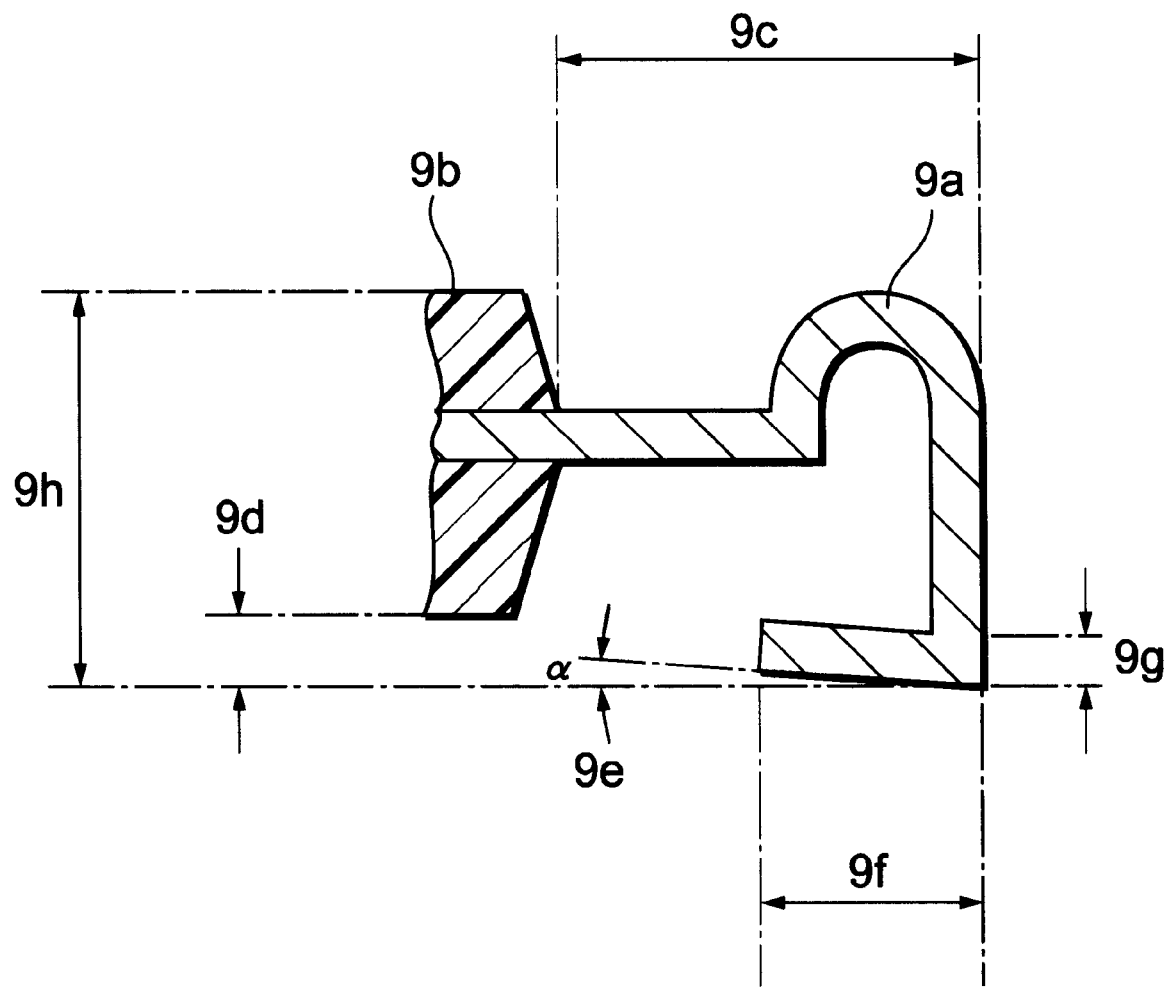
FIG. 9 is an enlarged partial sectional view of the semiconductor package according to an eighth embodiment of this invention.

FIG. 9 is an enlarged partial sectional view showing an eighth embodiment of the semiconductor device of this invention. In this embodiment, outer lead 9a has three inflection points, and it is bent vertically upward at a first inflection point, bent downward in inverted U shape at a second inflection point, and finally bent inward substantially horizontally at a third inflection point. The maximum height at the second inflection point of the outer lead 9a agrees with the height of the upper surface of the resin sealed body 9b, and the horizontal distance 9c of the outer lead 9a from the side face of the resin sealed body 9b to the point where the outer lead 9a completes bending at the second inflection point is given a dimension which satisfies the standardized value defined by the horizontal distance specifying item 11c.

In the semiconductor device of this embodiment, the values of the dimensions and the angle pertaining to the outer lead indicated by 9c to 9g satisfy all of the standardized values of the dimensions and the angle pertaining to the outer lead specified by the items 11c to 11g for the conventional semiconductor device as shown in FIG. 12. In addition, the height 9h of the semiconductor device meets the specification of the item 11h defining the height of the conventional semiconductor device as shown in FIG. 12.

However, it is not necessarily required that the height of the outer lead 9a at the second inflection point agree perfectly with the height of the upper surface of the resin sealed body 9b, and the height of the outer lead 9a at the second inflection point may be lower than the height of the upper surface of the resin sealed body 9b.

Figure 10:
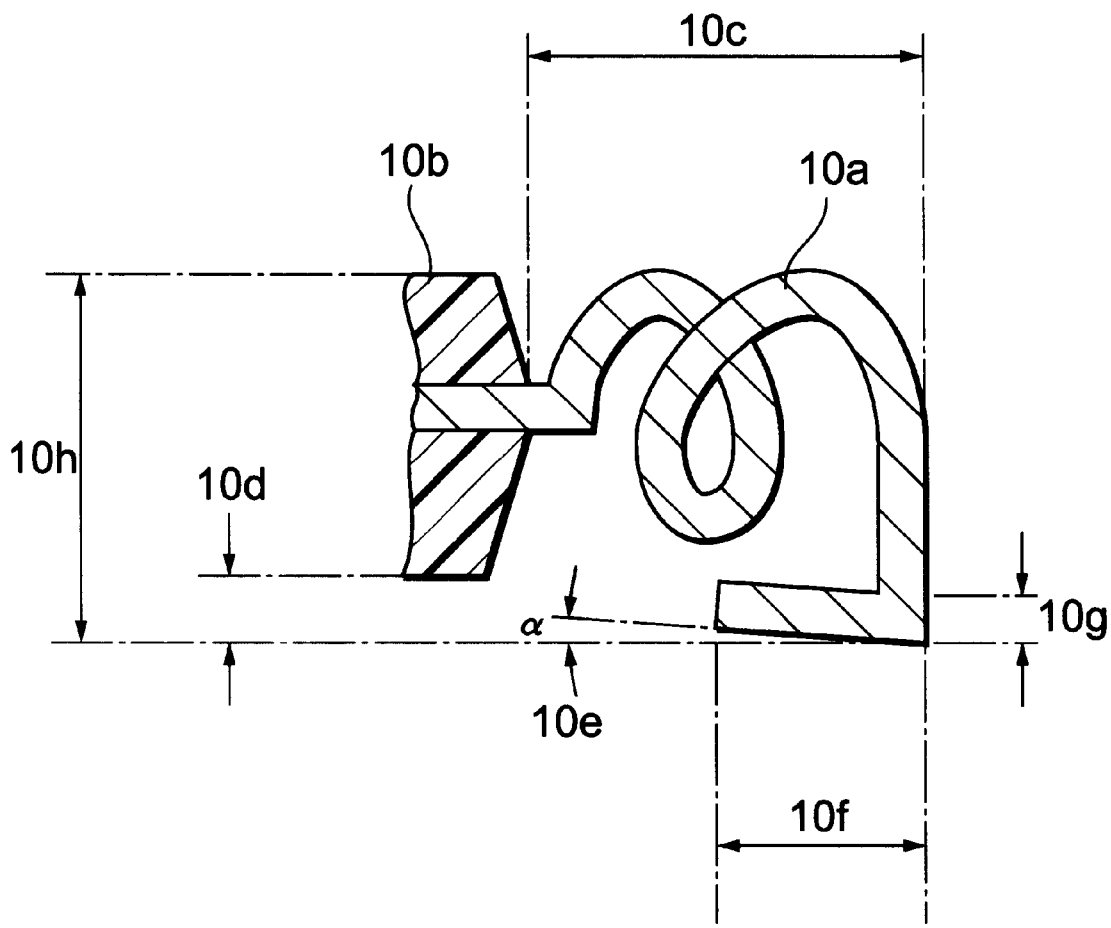
FIG. 10 is an enlarged partial sectional view of the semiconductor device according to a ninth embodiment of this invention.

FIG. 10 is an enlarged partial sectional view showing a ninth embodiment of this invention. In this embodiment, outer lead 10a has two inflection points and two turns of spirally shaped part. Namely, the outer lead 10a is bent upward at a first inflection point, and is bent, after passing through a spirally shaped part then going vertically downward, inward substantially horizontally at a second inflection point. The maximum height of the spirally shaped part of the outer lead 10a has the same height as the height of the upper surface of the resin sealed body 10b, and the horizontal distance 10c of the outer lead 10a from the side face of the resin sealed body 10b to its vertically dropping part is given a dimension satisfying the standardized value defined by the horizontal distance specifying item 11c.

In the semiconductor device of this embodiment, the values of the dimensions and the angle pertaining to the outer lead indicated by 10c to 10g satisfy all of the standardized values of the dimensions and the angle pertaining to the outer lead specified by the items 11c to 11g for the conventional semiconductor device as shown in FIG. 12.

In addition, the height 10h of the semiconductor device meets the specification of the item 11h defining the height of the conventional semiconductor device as shown in FIG. 12.

However, the maximum height of the spirally shaped part of the outer lead 10a is not necessarily required to agree perfectly with the height of the upper surface of the resin sealed body 10b, and the maximum height of the spirally shaped part may be lower than the height of the upper surface of the resin sealed body 10b.

Moreover, there is no particular restrictions on the number of turns of the spirally shaped part. In the example shown in FIG. 10, the number of turns of spirals is 1.5.

Furthermore, in the example shown in FIG. 10, the outer lead 10a is bent upward at the first inflection point, but this invention is not limited to this case only, and, for example, it may be bent downward there.

As described in the above, according to this invention, in a surface mounted semiconductor device, it is possible to give larger length to the outer lead of gull wing type while satisfying the dimensional specifications of the conventional gull wing type outer lead. Accordingly, it is possible to make the outer leads function sufficiently effectively as a buffer material against the difference in elongation/contraction which may arise in each of the resin sealed body, the outer leads, and the mount board, brought about by heat generation and heat dissipation caused by electrical operation of the semiconductor device and/or caused by the temperature changes in the environment in which the semiconductor device and the mount board, having the semiconductor device on it, are installed or otherwise left standing.

With this arrangement, it is possible to prevent the deterioration in the bonding strength of solder which connects the semiconductor device to the mount board, and to preclude the failure of peeling of the semiconductor device off the mount board.

Moreover, since the outer lead according to this invention satisfies all of the conventional specifications pertaining to the semiconductor device, it is possible to obtain the above effect without change in the mount board and without sacrificing the packaging density.

It is apparent that the present invention is not limited to the above embodiments, but may be modified and changed without departing from the scope and spirit of the invention.

What is claimed is:

1. A semiconductor package comprising:

a resin molded body into which a semiconductor chip is molded; and a plurality of outer leads led out from said resin molded body; each of said outer leads having first and second inflection parts, each of bending angles at said first and second inflection parts being less than 90°, wherein each of said outer leads includes a first portion being defined from a lead-out point from said resin molded body to said first inflection part, a second portion being defined from said first inflection part to said second inflection part, and a third portion being defined from said second inflection part to a terminating point, said first portion being longer than said third portion, wherein said terminating point is located closer to said resin molded body than said second inflection part.

2. A semiconductor package comprising:

a resin molded body having a semiconductor chip molded therein; and a plurality of outer leads led out from said resin sealed body, each of said outer leads having a lead-out portion at which said outer lead is led out from said resin sealed body, a fixing portion which is fixed to a printed wiring board, and a connection portion which connects said lead-out portion and said fixing portion, said connection portion having a property of a spring, wherein said connecting portion is formed in a spiral shape.

3. A semiconductor package comprising:

a resin molded body into which a semiconductor chip is molded; and a plurality of outer leads led out from said resin molded body, each of said outer leads including first through fourth inflection portions each having a bending angle, wherein each of the bending angles at said first and second inflection portions is substantially 90° and each of the bending angles at the third and fourth inflection portions is selectively chosen to have any angle.

4. The package according to claim 3, wherein each of the bending angles of said first through fourth inflection portions is substantially 90°.

5. The package according to claim 3, wherein a first portion is formed by a led-out portion of said outer lead from the resin molded body to the first inflection portion, a second portion is formed by a segment from the first inflection portion to said second inflection portion, and a third portion is formed by a segment from said second inflection portion to said third inflection portion, and wherein a fourth portion is formed by a segment from said third inflection portion to said fourth inflection portion, and a fifth portion is formed by a segment from said fourth inflection portion to a terminating portion of said outer lead.

6. The package according to claim 5, wherein an angle formed by said first and second portions and the angle formed by the fourth and fifth portions are both about 90°.

7. The package according to claim 6, wherein an angle formed by the second and third portions and the angle formed by the third and fourth portions are selectively set to any of more than about 90° and less than about 90°.

8. The package according to claim 7, wherein said fifth portion extends in a direction away from said resin molded body.

9. A semiconductor package comprising:

a resin molded body into which a semiconductor chip is molded; and a plurality of outer leads led out from said resin molded body, each of said outer leads having first, second and third inflection portions having a bending angle, wherein a bending angle at said first inflection portion is substantially between about 90° and about 180°, and a bending angle at said second inflection portion is substantially between about 0° and about 90°, wherein the outer lead is bent substantially in a horizontal direction at the third inflection portion.

10. The package according to claim 9, wherein the outer lead is bent upwardly at the first inflection portion, is bent downwardly at the second inflection portion, and is bent outwardly in a direction away from said resin molded body at the third inflection portion.

11. The package according to claim 9, wherein a height of the outer lead at the second inflection portion is substantially equal to a height of an upper surface of the resin molded body.

12. The package according to claim 9, wherein a height of the outer lead at the second inflection portion is lower than a height of an upper surface of the resin sealed body.

13. The package according to claim 12, wherein a first portion is formed by a led-out portion of said outer lead from the resin molded body to the first inflection portion, and a second portion is formed by a segment from the first inflection portion to said second inflection portion, and wherein a third portion is formed by a segment from said second inflection portion to said third inflection portion, and a fourth portion is formed by a segment from said third inflection portion to a terminating portion of said outer lead.

14. The package according to claim 13, wherein an angle formed by the first and second portions is larger than about 90°, and an angle formed by the second and third portions is less that about 90°.

15. The package according to claim 14, wherein an angle formed by said third and fourth portions is freely set to any of more than about 90°and less than about 90°.

16. A semiconductor package comprising:

a resin molded body into which a semiconductor chip is molded; and a plurality of outer leads led out from said resin molded body, each of said outer leads having first, second, third, and fourth inflection portions each having a bending angle, each of the bending angles at said first and second inflection parts being less than 90°.

17. The package according to claim 16, wherein the outer lead is bent vertically downwardly at the first inflection portion, is bent upwardly with an acute angle at the second inflection portion, bent vertically downwardly with an acute angle at the third inflection portion, and bent substantially horizontally inwardly in a direction toward the molded body at the fourth inflection portion.

18. The package according to claim 16, wherein a height of the outer lead at the third inflection portion is substantially equal to a height of an upper surface of the resin molded body.

19. The package according to claim 16, wherein a height of the outer lead at the third inflection portion is lower than a height of an upper surface of the resin sealed body.

20. The package according to claim 16, wherein a first portion is formed by a led-out portion of said outer lead from the resin molded body to the first inflection portion, a second portion is formed by a segment from the first inflection portion to said second inflection portion, and a third portion is formed by a segment from said second inflection portion to said third inflection portion, and wherein a fourth portion is formed by a segment from said third inflection portion to the fourth inflection portion, and a fifth portion is formed by a segment from said fourth inflection portion to a terminating portion of said outer lead.

21. The package according to claim 20, wherein an angle formed by the first and second portions is freely selected, and the angle formed by said fourth and fifth portions is about 90°.

22. The package according to claim 21, wherein an angle formed by the second and third portions and an angle formed by the third and fourth portions are both about 50°.

* * * * *